United States Patent
Lee et al.

(10) Patent No.: US 7,964,880 B2
(45) Date of Patent: Jun. 21, 2011

(54) LIGHT EMITTING ELEMENT WITH A PLURALITY OF CELLS BONDED, METHOD OF MANUFACTURING THE SAME, AND LIGHT EMITTING DEVICE USING THE SAME

(75) Inventors: Chung-Hoon Lee, Gwangmyeong-si (KR); Keon-Young Lee, Ansan-si (KR); Lacroix Yves, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 12/944,412

(22) Filed: Nov. 11, 2010

(65) Prior Publication Data

US 2011/0062465 A1 Mar. 17, 2011

Related U.S. Application Data

(63) Continuation of application No. 12/685,145, filed on Jan. 11, 2010, now Pat. No. 7,871,839, which is a continuation of application No. 11/571,499, filed as application No. PCT/KR2005/002033 on Jun. 29, 2005, now Pat. No. 7,804,098.

(30) Foreign Application Priority Data

| Jun. 30, 2004 | (KR) | ............................. 2004-0049906 |
| Oct. 29, 2004 | (KR) | ............................. 2004-0087379 |
| Dec. 11, 2004 | (KR) | ............................. 2004-0104569 |

(51) Int. Cl.
*H01L 29/18* (2006.01)

(52) U.S. Cl. ............ 257/88; 257/E31.099; 257/E31.105

(58) Field of Classification Search ............ 257/88, 257/94–95, 99, 100, E31.099, E31.105; 438/31–34, 438/FOR. 157

See application file for complete search history.

(56) References Cited

U.S. PATENT DOCUMENTS 3,613,558 A 10/1971 Math
(Continued)

FOREIGN PATENT DOCUMENTS

EP 1553641 7/2005
(Continued)

OTHER PUBLICATIONS

Office Action of U.S. Appl. No. 11/571,499 issued on Oct. 1, 2009.
(Continued)

*Primary Examiner* — Brook Kebede
(74) *Attorney, Agent, or Firm* — H.C. Park & Associates, PLC

(57) ABSTRACT

The present invention relates to a light emitting element with arrayed cells, a method of manufacturing the same, and a light emitting device using the same. The present invention provides a light emitting element including a light emitting cell block with a plurality of light emitting cells connected in series or parallel on a single substrate, and a method of manufacturing the same, wherein each of the plurality of light emitting cells includes an N-type semiconductor layer and a P-type semiconductor layer, and the N-type semiconductor layer of one light emitting cell is electrically connected to the P-type semiconductor layer of another adjacent light emitting cell. Further, the present invention provides a light emitting device including a light emitting element with a plurality of light emitting cells connected in series. Accordingly, it is possible to simplify a manufacturing process of a light emitting device for illumination capable of being used with a household AC power source, to decrease a fraction defective occurring in manufacturing a light emitting device for illumination, and to mass-produce the light emitting device for illumination. Further, there is an advantage in that DC driving efficiency can be enhanced in an AC operation by installing a predetermined rectifying circuit outside the light emitting element.

26 Claims, 13 Drawing Sheets

(a)

(b)

U.S. PATENT DOCUMENTS

| | | | |
|---|---|---|---|
| 3,875,473 | A | 4/1975 | Lebailly |
| 4,586,002 | A | 4/1986 | Carver |
| 5,463,280 | A | 10/1995 | Johnson |
| 6,818,531 | B1 | 11/2004 | Yoo et al. |
| 7,285,801 | B2 * | 10/2007 | Eliashevich et al. ............ 257/96 |
| 2002/0139987 | A1 * | 10/2002 | Collins et al. ................... 257/88 |
| 2004/0080941 | A1 | 4/2004 | Jiang et al. |
| 2004/0239242 | A1 | 12/2004 | Mano et al. |

FOREIGN PATENT DOCUMENTS

| | | |
|---|---|---|
| JP | 05-198843 | 8/1993 |
| JP | 06-077527 | 3/1994 |
| JP | 11-150303 | 6/1999 |
| JP | 2000-101136 | 4/2000 |
| JP | 2000-306685 | 11/2000 |
| JP | 2001-307506 | 11/2001 |
| JP | 2002-111118 | 4/2002 |
| JP | 2002-359402 | 12/2002 |
| JP | 2003-198046 | 7/2003 |
| JP | 2004-006582 | 1/2004 |
| JP | 2004-512687 | 4/2004 |
| JP | 2004-207649 | 7/2004 |
| KR | 2001-0027791 | 4/2001 |
| KR | 2004-0009818 | 1/2004 |
| WO | 03/088318 | 10/2003 |
| WO | 2004/023568 | 3/2004 |

OTHER PUBLICATIONS

Final Office Action of U.S. Appl. No. 11/571,499 issued on Mar. 18, 2010.

Notice of Allowance of U.S. Appl. No. 11/571,499 issued on Jul. 28, 2010.

Office Action of U.S. Appl. No. 12/685,145 issued on Apr. 16, 2010.

Final Office Action of U.S. Appl. No. 12/685,145 issued on Sep. 17, 2010.

Notice of Allowance of U.S. Appl. No. 12/685,145 issued on Oct. 29, 2010.

European Search Report of EP 05 76 5903 issued on Feb. 25, 2011.

* cited by examiner

[Fig. 1]
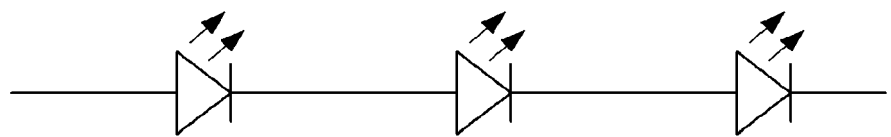
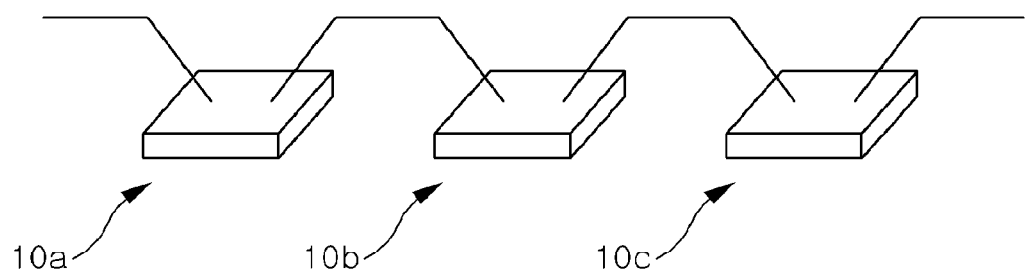
[Fig. 2]
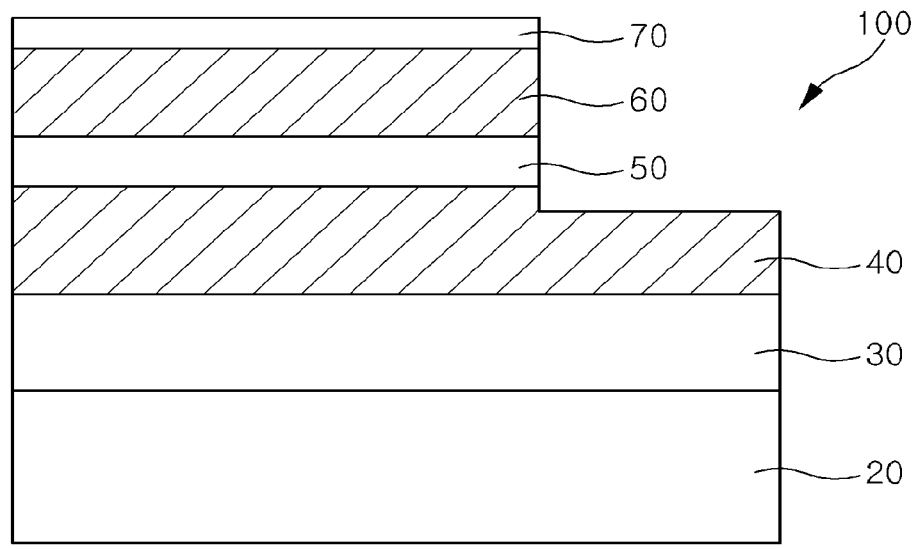

[Fig. 3]
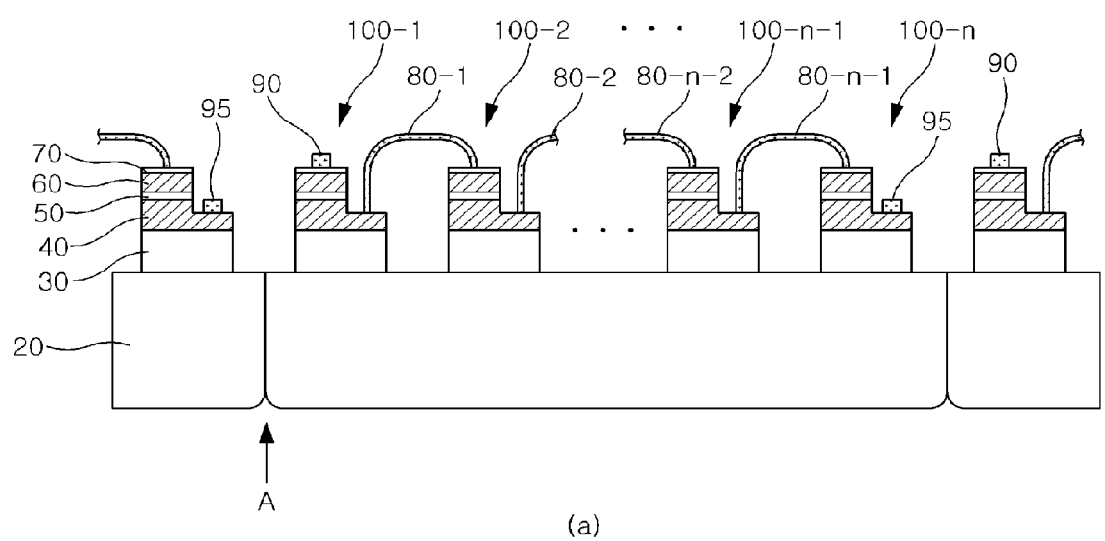
(a)
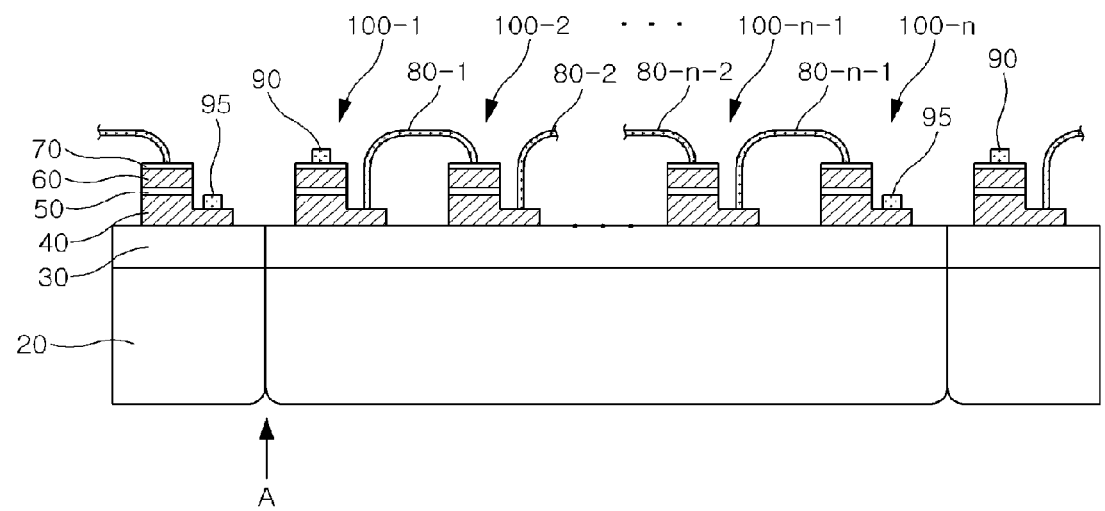
(b)

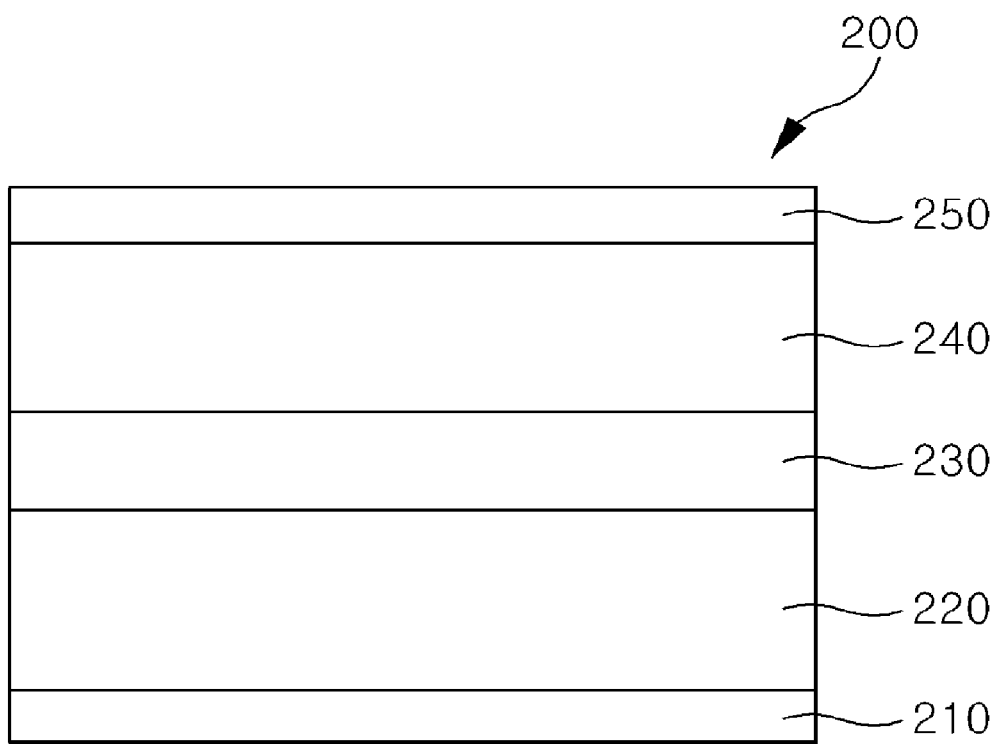

[Fig. 5]
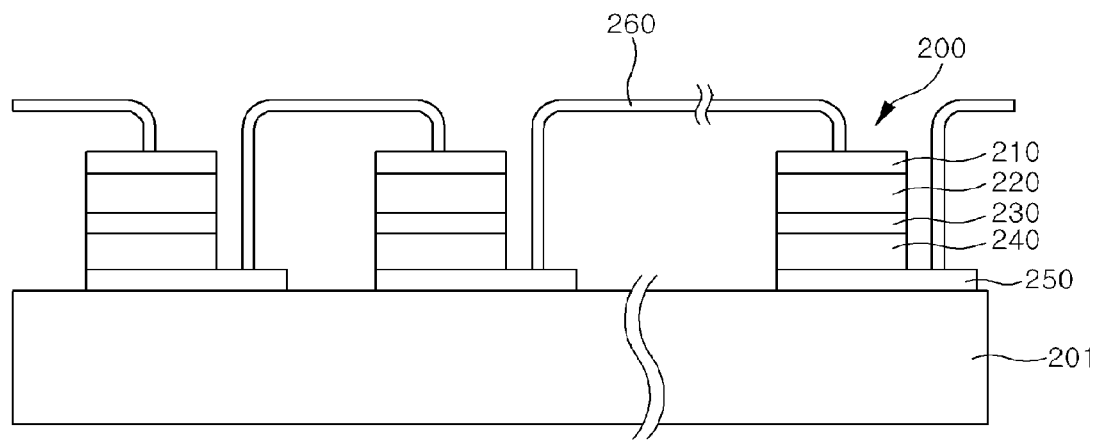
(a)
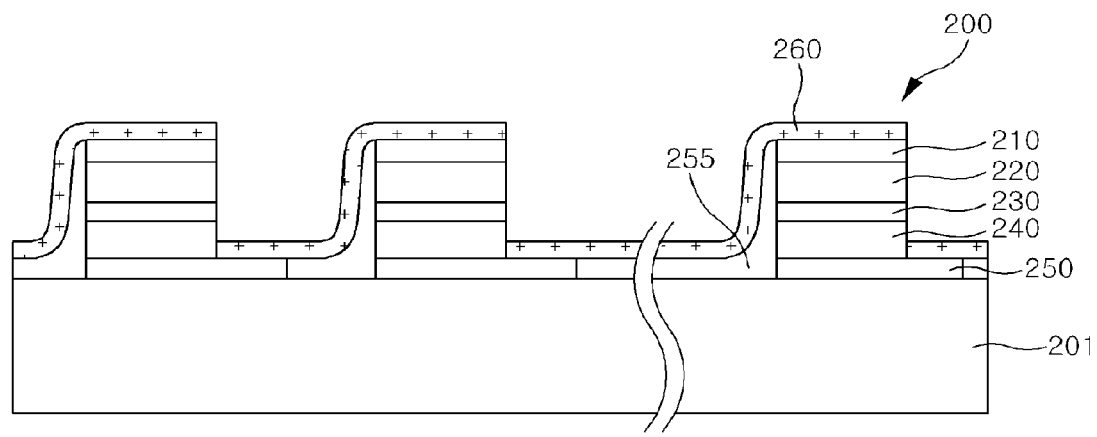
(b)

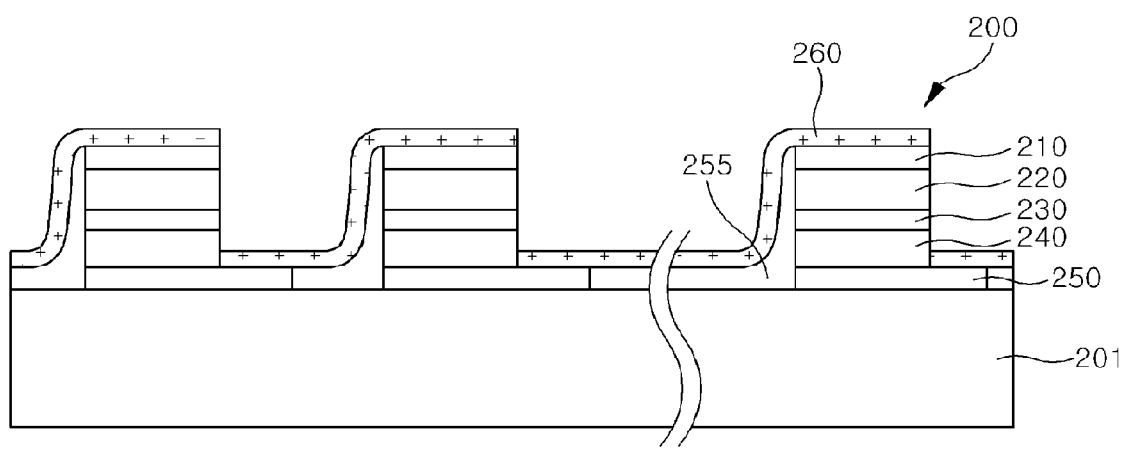
[Fig. 6]

[Fig. 7]
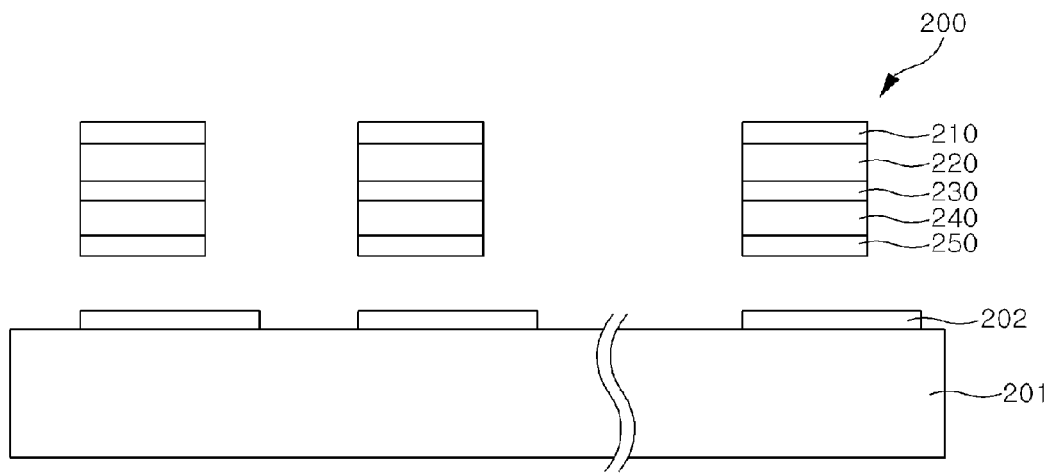
(a)
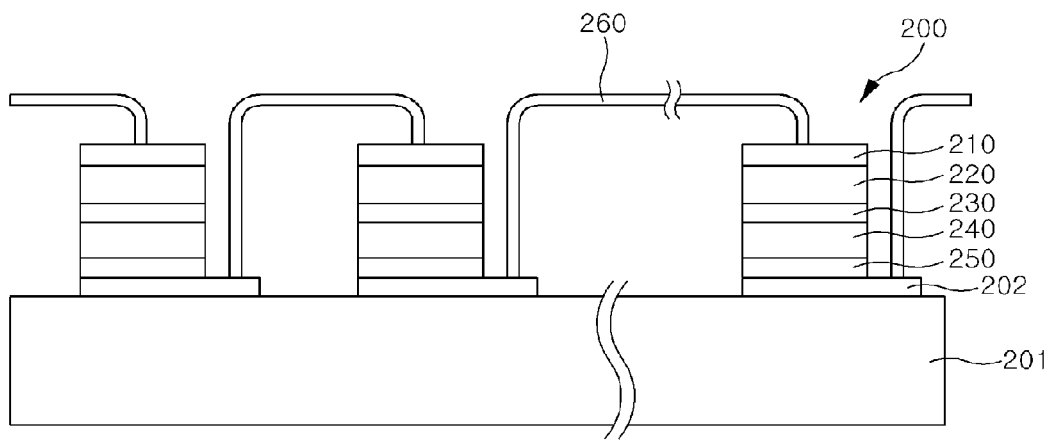
(b)

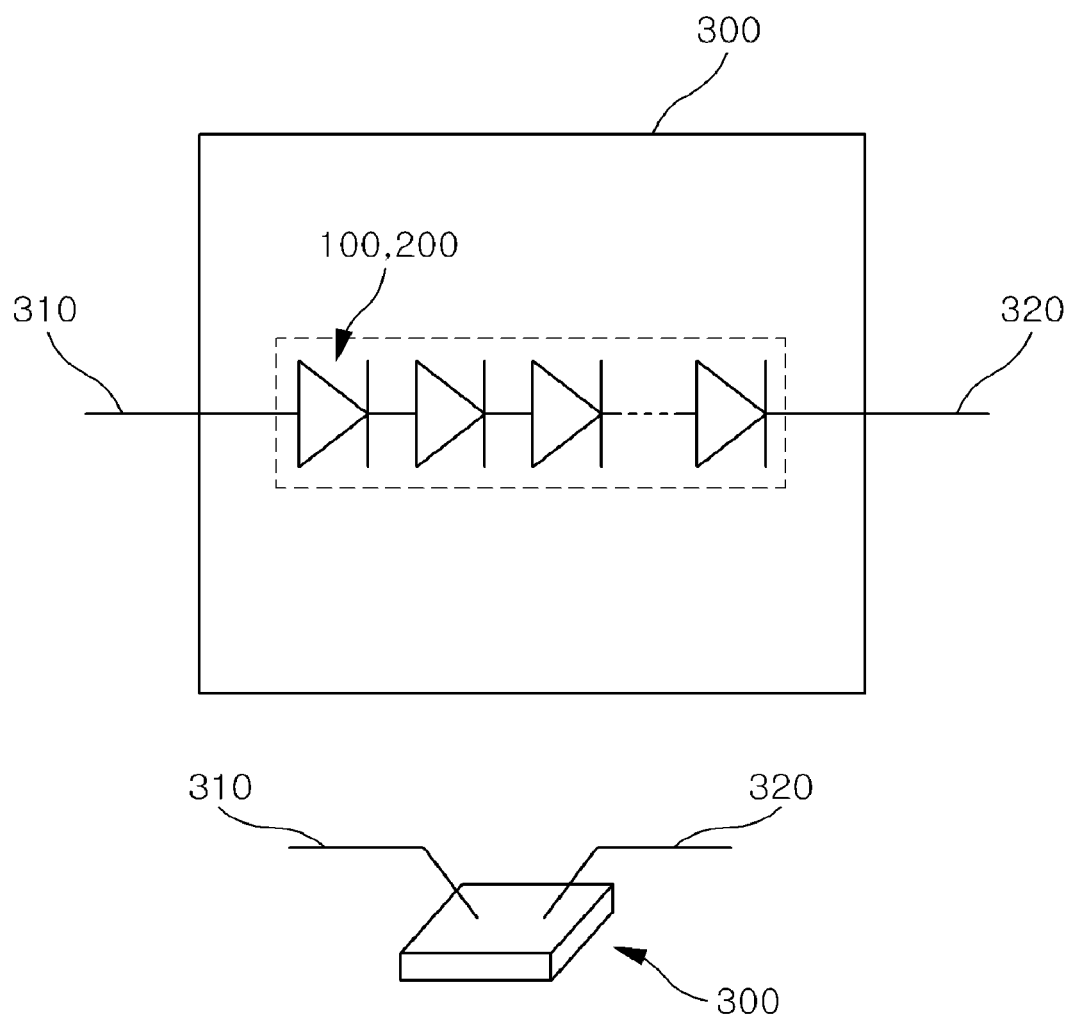
[Fig. 8]

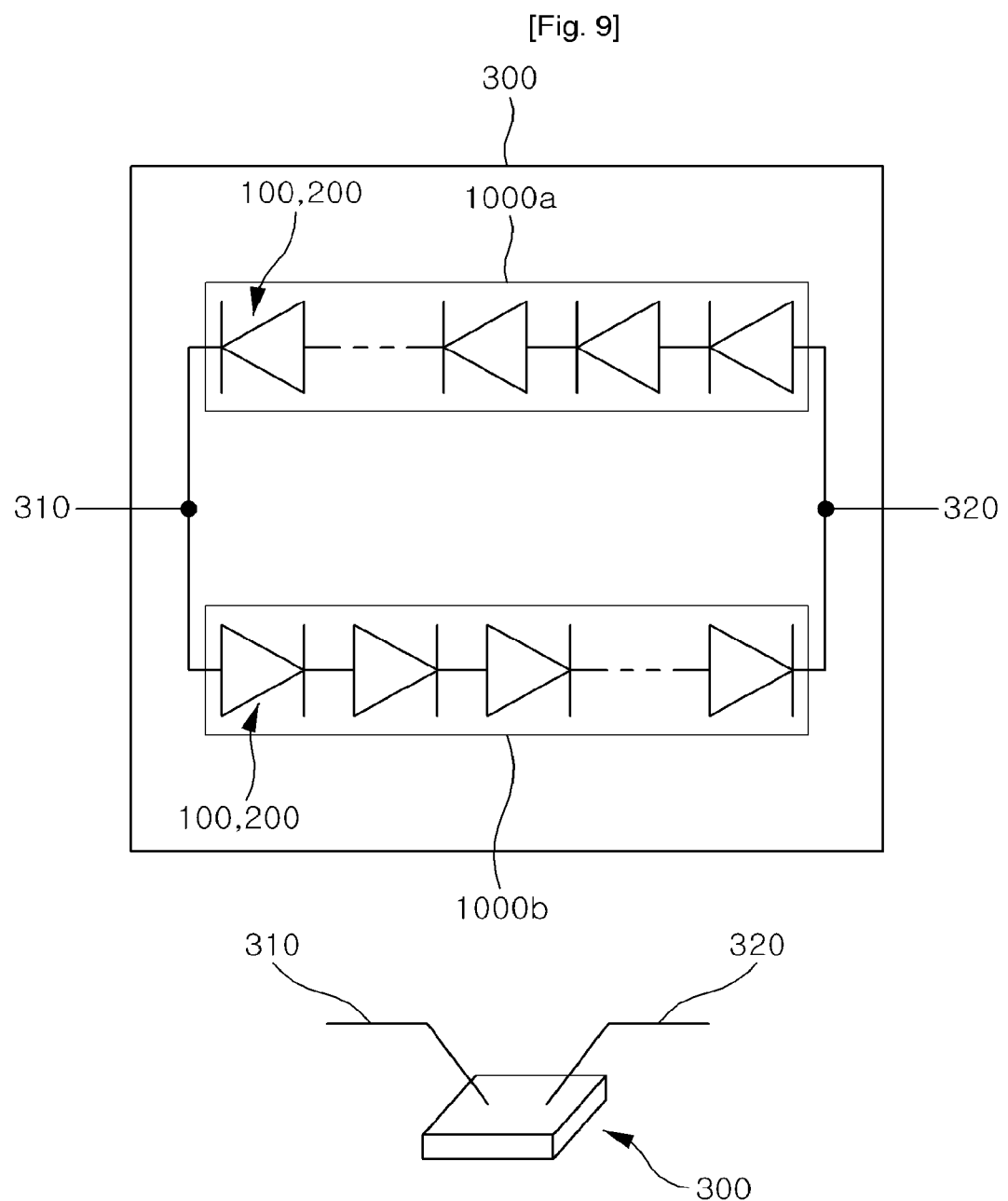

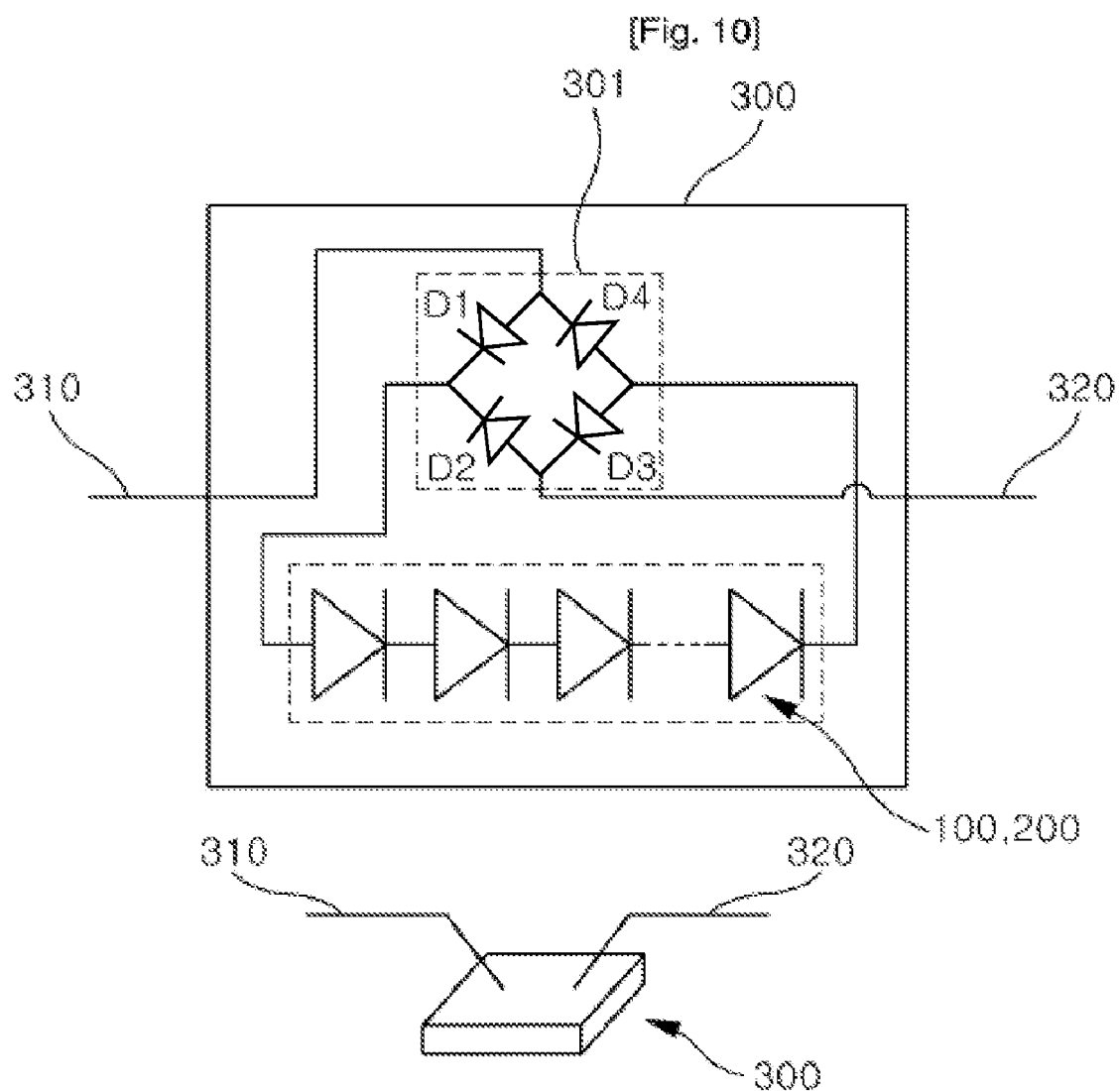
[Fig. 10]

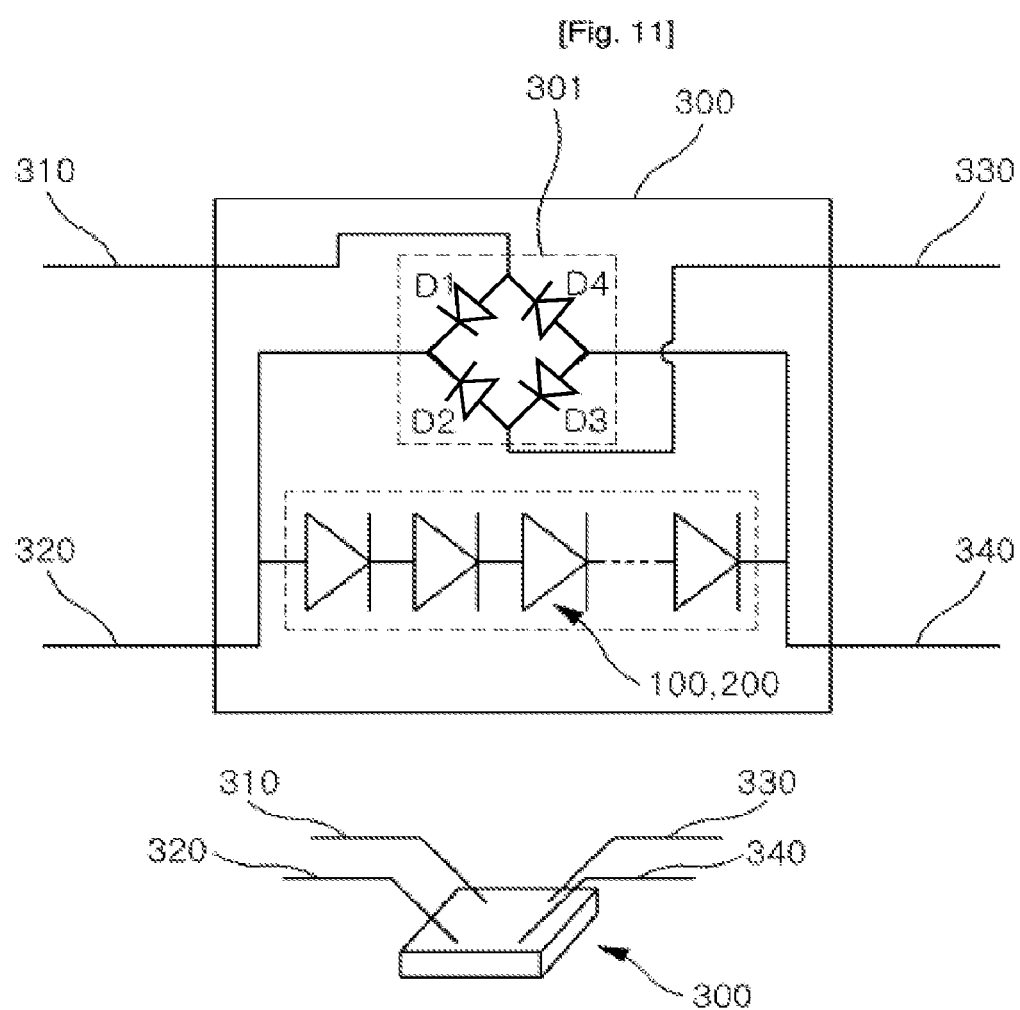

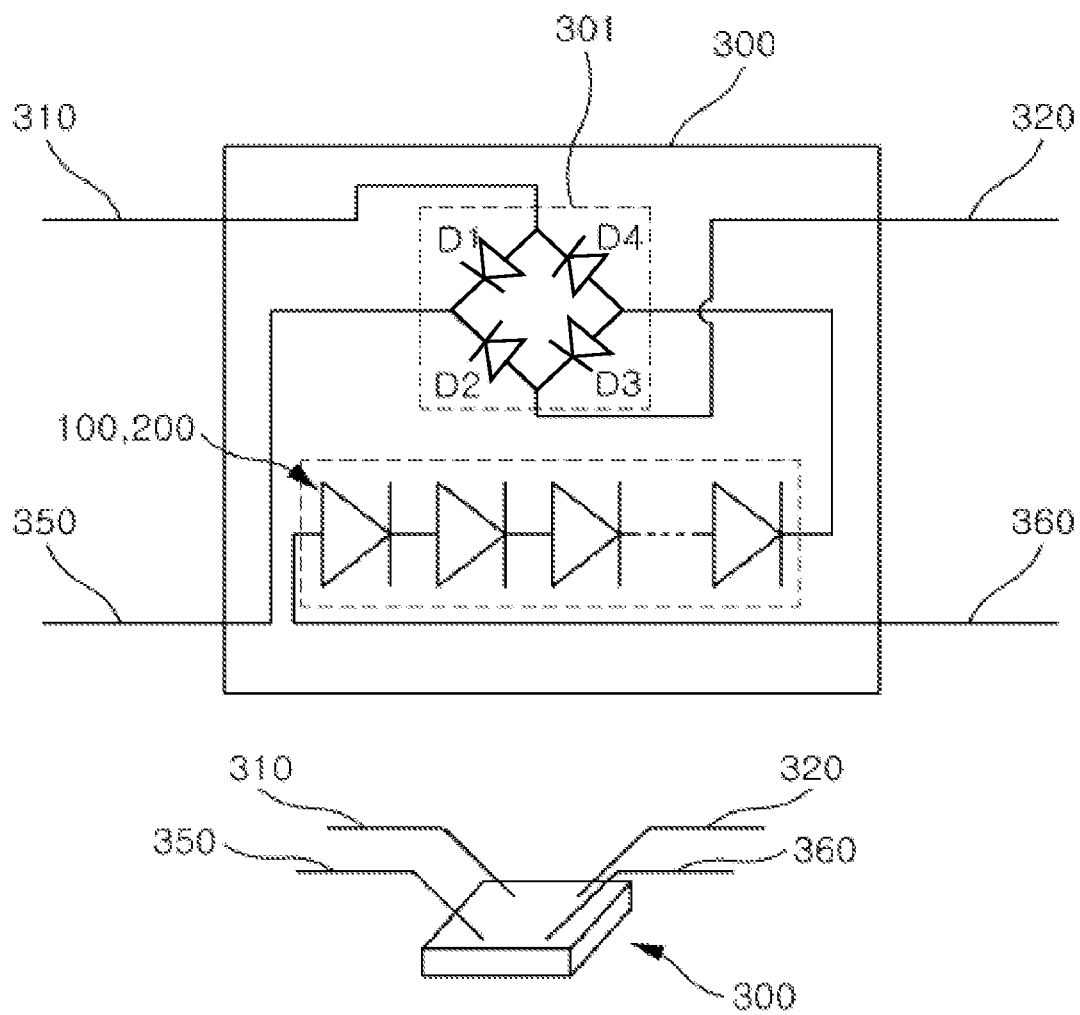

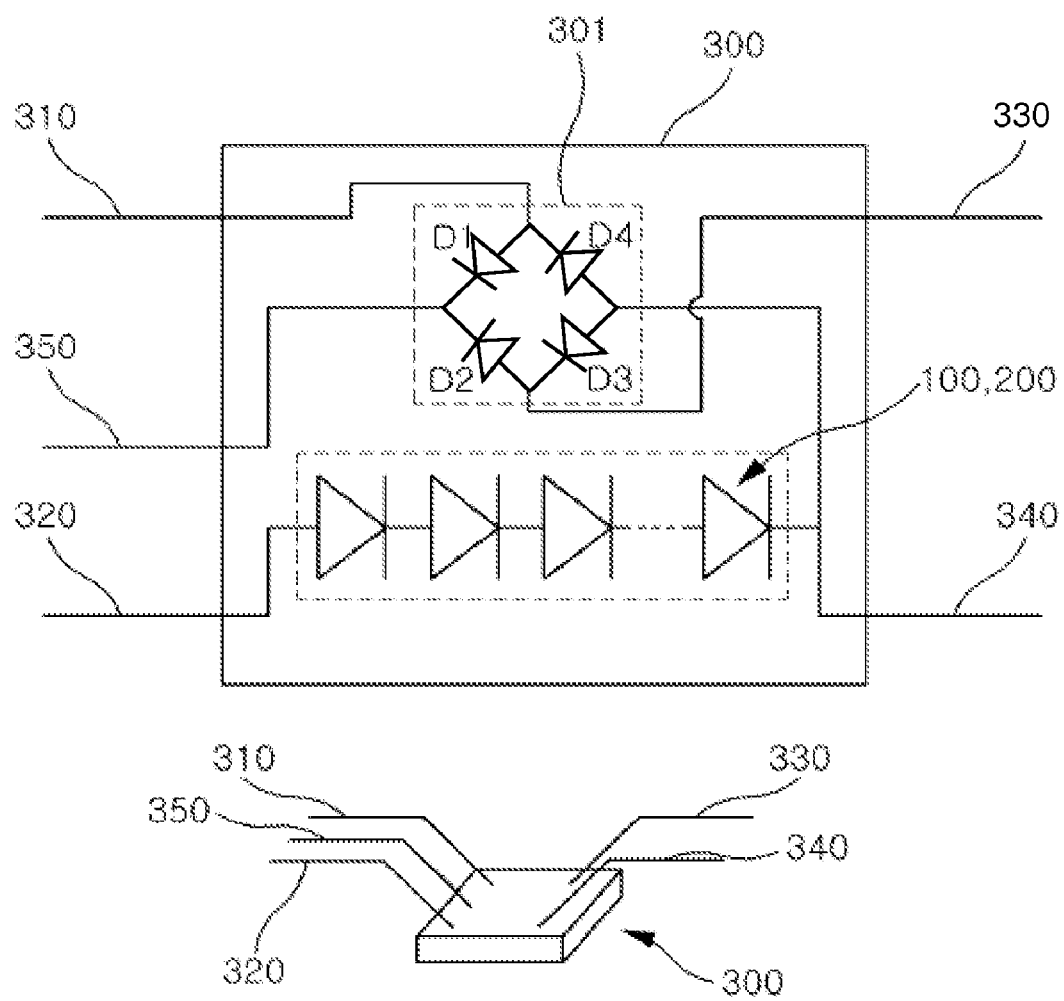
[Fig. 13]

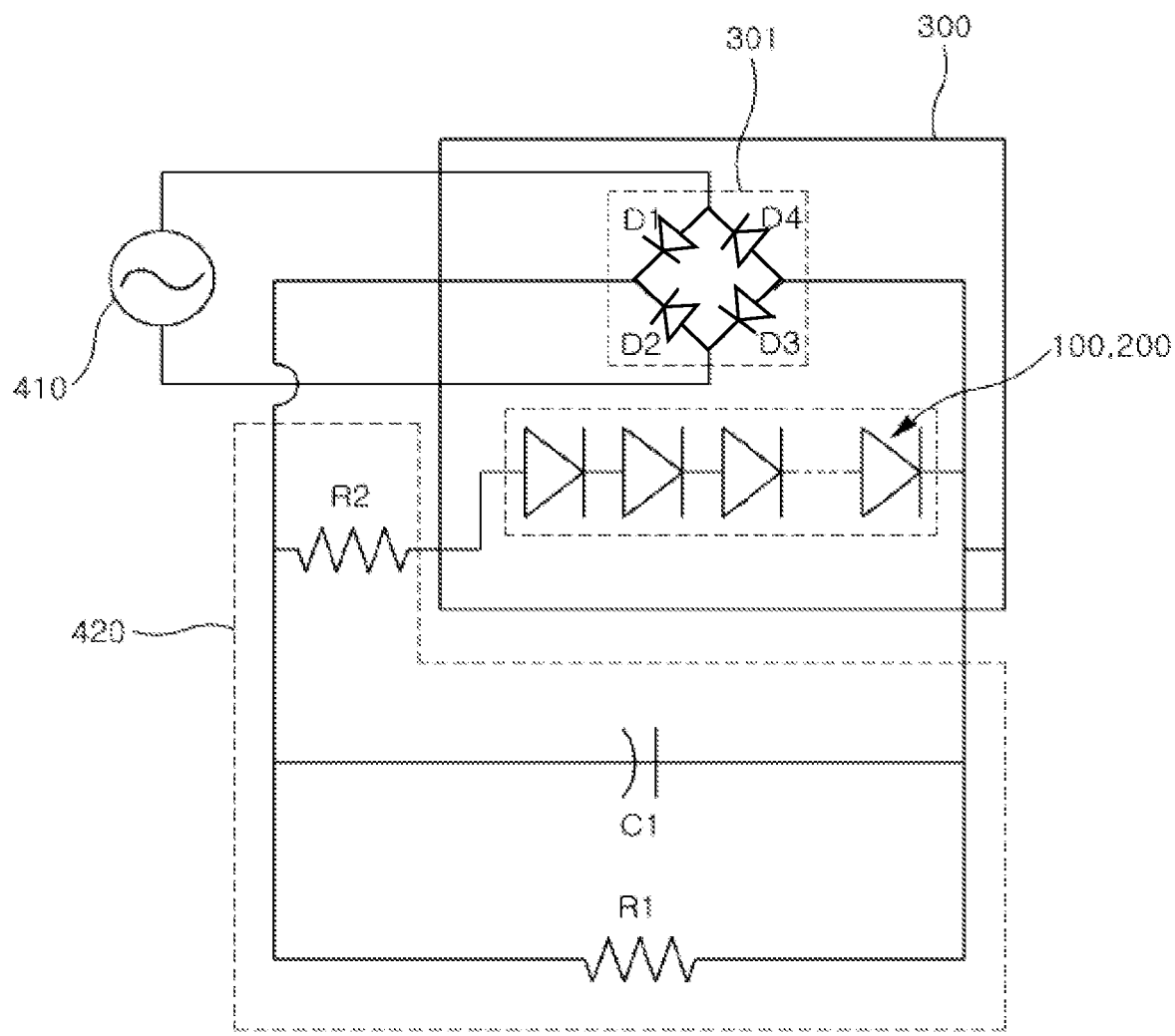
[Fig. 14]

LIGHT EMITTING ELEMENT WITH A PLURALITY OF CELLS BONDED, METHOD OF MANUFACTURING THE SAME, AND LIGHT EMITTING DEVICE USING THE SAME

CROSS REFERENCE TO RELATED APPLICATIONS

This application is a continuation of U.S. application Ser. No. 12/685,145, filed on Jan. 11, 2010, which is a continuation of U.S. application Ser. No. 11/571,499, filed on Dec. 29, 2006, which is the National Stage of International Application No. PCT/KR05/02033, filed on Jun. 29, 2005, and claims priority from and the benefit of Korean Patent Application No. 2004-0104569, filed on Dec. 11, 2004, Korean Patent Application No. 2004-0087379, filed on Oct. 29, 2004, and Korean Patent Application No. 2004-0049906, filed on Jun. 30, 2004, which are all hereby incorporated by reference for all purposes as if fully set forth herein.

BACKGROUND OF THE INVENTION

1. Field of the Invention

The present invention relates to a light emitting element with a plurality of cells bonded, a method of manufacturing the same, and a light emitting device using the same. More particularly, the present invention relates to a single light emitting element with a plurality of light emitting cells arrayed on a single substrate, a method of manufacturing the same, and a light emitting device using the same.

2. Discussion of the Background

A light emitting diode refers to an element in which minority carriers (electrons or holes) injected using a p-n junction structure of a semiconductor are produced and certain light is emitted through recombination thereof. Such light emitting diodes have been used as display devices and backlights, and studies on application of the light emitting diodes to general illumination have been actively conducted.

This is because light emitting diodes have less electric power consumption and longer lifespan as compared with existing bulbs or fluorescent lamps. That is, this is because the electric power consumption of light emitting diodes is only one severalth to one several tenth, and the lifespan thereof is several to several ten times as compared with existing illuminators, thereby achieving reduced electric power consumption and excellent durability.

Generally, to use a light emitting diode for the purpose of illumination, light emitting elements are formed through a separate packaging process, the plurality of light emitting elements are connected in series by means of wire bonding, and a protection circuit, an alternate current/direct current (AC/DC) converter and the like are installed at the outside of the light emitting elements so that the light emitting diode can be manufactured in the form of a lamp.

FIG. 1 is a conceptual diagram illustrating a conventional light emitting device.

Referring to FIG. 1, a light emitting device for general illumination is manufactured by serially connecting a plurality of light emitting elements 10a to 10c each of which has a light emitting chip mounted thereon. To this end, the plurality of light emitting elements 10a to 10c are arrayed in series, and the light emitting chips within the different light emitting elements are electrically connected in series through a metal wiring process. Such a manufacturing process is disclosed in U.S. Pat. No. 5,463,280. However, if a light emitting device for general illumination having the aforementioned structure is manufactured according to the prior art, there is a problem in that the metal wiring process should be performed for a large number of elements one by one so that processing steps increase in number and are complicated. As the number of the process steps increases, a fraction defective also increases, thereby impeding mass production. Further, there may be a case where metal wiring becomes a short circuit due to a certain shock so that the operations of light emitting elements are stopped. Furthermore, there is a disadvantage in that spaces occupied due to serial array of respective light emitting elements are expanded so that the size of a lamp considerably becomes large.

An array of microchips at a wafer level rather than the array of light emitting chips at an element level described above is disclosed Korean Patent Laid-Open Publication No. 2004-9818. This relates to a display apparatus, wherein light emitting cells are arrayed in a matrix form such that a light emitting diode for inducing luminescence is disposed in each pixel. However, different electric signals should be applied in respective vertical and horizontal directions and the electric signals should be supplied in an address manner so as to cause the elements arranged in the matrix form to emit light, which is very difficult to control. Further, wiring may be disconnected due to the array in the form of a matrix, and a great deal of interference occurs in wire-overlapping areas. Furthermore, there is a problem in that the aforementioned matrix-shaped structure is not applicable to a light emitting device for illumination to which a high voltage is applied.

SUMMARY OF THE INVENTION

Accordingly, the present invention is conceived to solve the aforementioned problems. An object of the present invention is to provide a light emitting element with arrayed light emitting cells, a method of manufacturing the same, and a light emitting device using the same, wherein a light emitting diode lamp can be manufactured using a single chip type light emitting element with a plurality of light emitting cells connected in series, and the process of manufacturing the lamp can be simplified and have a reduced fraction defective through electrical connection of the plurality of light emitting cells at a wafer level, thereby providing benefits in mass production.

According to an aspect of the present invention, there is provided a light emitting element, comprising a light emitting cell block with a plurality of light emitting cells connected to one another in series or parallel on a single substrate.

The light emitting cell block may comprise the plurality of light emitting cells each of which includes an N-type semiconductor layer, an active layer formed in a pre-determined region on an upper surface of the N-type semiconductor layer, and a P-type semiconductor layer formed on the active layer; and a wire for connecting the N-type semiconductor layer of one light emitting cell to the P-type semiconductor layer of another adjacent light emitting cell. Further, the light emitting cell block may comprise the plurality of light emitting cells each of which has an N-type semiconductor layer, an active layer and a P-type semiconductor layer sequentially laminated; the substrate with the plurality of light emitting cells bonded thereto; and a wire for connecting the N-type semiconductor layer of one light emitting cell to the P-type semiconductor layer of another adjacent light emitting cell. An N-type pad may be formed on the N-type semiconductor layer, and a P-type pad may be formed on the P-type semiconductor layer.

At this time, the light emitting element may further comprise a rectifying bridge unit for applying predetermined rectified power to the light emitting cells. The light emitting element may further comprise electrodes for connecting an external AC source to the rectifying bridge unit. The light emitting element may further comprise electrodes for connecting the light emitting cells and the rectifying bridge unit to an external power source or an external element. Light emitting cell blocks with light emitting cells connected in series may be connected in reverse parallel on the substrate. The substrate may be made of a thermally conductive material. The light emitting element may further comprise an insulation film formed on a top surface of the thermally conductive substrate if the substrate has electrical conductivity; and an electrode pattern interposed between the insulation film and the light emitting cells.

According to another aspect of the present invention, there is provided a method of manufacturing a light emitting element, comprising the steps of preparing a plurality of light emitting cells each of which has an N-type semiconductor layer and a P-type semiconductor layer; and connecting the N-type semiconductor layer of one light emitting cell to the P-type semiconductor layer of an adjacent light emitting cell through a metallic wire. The step of preparing the plurality of light emitting cells may comprise the steps of sequentially forming the N-type semiconductor layer, an active layer and the P-type semiconductor layer on a parent substrate; exposing a portion of the N-type semiconductor layer; and electrically insulating the individual light emitting cells. The step of preparing the plurality of light emitting cells may comprise the steps of sequentially forming the N-type semiconductor layer, an active layer and the P-type semiconductor layer on a parent substrate; electrically insulating the individual light emitting cells by partially removing the P-type semiconductor layer, the active layer and the N-type semiconductor layer; bonding a host substrate on the electrically insulated P-type semiconductor layer; removing the parent substrate; and cutting the host substrate to form the individual light emitting cells. The method may further comprise the step of bonding the light emitting element on a substrate.

According to a further aspect of the present invention, there is provided a light emitting device, comprising a light emitting element with a plurality of light emitting cells connected in series or parallel on a single substrate; a power source unit for applying predetermined power to the light emitting element; and a control unit for controlling waveforms of a voltage and a current applied to the light emitting element.

According to the present invention, it is possible to manufacture a light emitting device capable of being used for illumination through a single light emitting element with a plurality of light emitting cells connected in series.

Further, since a plurality of light emitting cells are electrically connected at a wafer level, it is possible to manufacture a light emitting element capable of emitting light with a high voltage and a household AC power source.

Furthermore, since a light emitting element with a plurality of light emitting cells electrically connected on a substrate is used, it is possible to simplify a manufacturing process of a light emitting device for illumination, to decrease a fraction defective occurring in manufacturing a light emitting device for illumination, and to mass-produce the light emitting device for illumination.

In addition, electrodes of a light emitting element chip and a predetermined rectifying circuit are connected to minimize a ripple factor in AC driving, thereby maximizing light emitting efficiency and to control a load on an LED array through connection of a resistor, thereby protecting the light emitting element chip.

BRIEF DESCRIPTION OF THE DRAWINGS

FIG. 1 is a conceptual diagram illustrating a conventional light emitting device.

FIG. 2 is a sectional view of a unit light emitting cell according to an embodiment of the present invention.

FIG. 3 shows sectional views of a light emitting element with arrayed light emitting cells according to an embodiment of the present invention.

FIG. 4 is a sectional view of a unit light emitting cell according to another embodiment of the present invention.

FIG. 5 shows sectional views illustrating a method of manufacturing a light emitting element with arrayed light emitting cells according to a first modified example of the other embodiment of the present invention.

FIG. 6 is a sectional view illustrating a method of manufacturing a light emitting element with arrayed light emitting cells according to a second modified example of the other embodiment of the present invention.

FIG. 7 shows sectional views illustrating a method of manufacturing a light emitting element with arrayed light emitting cells according to a third modified example of the other embodiment of the present invention.

FIG. 8 is a conceptual diagram illustrating a light emitting element according to a first embodiment of the present invention.

FIG. 9 is a conceptual diagram illustrating a light emitting element according to a second embodiment of the present invention.

FIG. 10 is a conceptual diagram illustrating a light emitting element according to a third embodiment of the present invention.

FIG. 11 is a conceptual diagram illustrating a light emitting element according to a fourth embodiment of the present invention.

FIG. 12 is a conceptual diagram illustrating a light emitting element according to a fifth embodiment of the present invention.

FIG. 13 is a conceptual diagram illustrating a light emitting element according to a sixth embodiment of the present invention.

FIG. 14 is a conceptual diagram illustrating a light emitting device according to the present invention.

DETAILED DESCRIPTION OF THE ILLUSTRATED EMBODIMENTS

Hereinafter, preferred embodiments of the present invention will be described in detail with reference to the accompanying drawings. However, the present invention is not limited to the embodiments but may be implemented into different forms. These embodiments are provided only for illustrative purposes and for full understanding of the scope of the present invention by those skilled in the art. Throughout the drawings, like components are designated by like reference numerals.

FIG. 2 shows a sectional view of a unit light emitting cell according to an embodiment of the present invention.

Referring to FIG. 2, a light emitting cell 100 comprises a substrate 20; a buffer layer 30, an N-type semiconductor layer 40, an active layer 50 and a P-type semiconductor layer 60, which are sequentially laminated on the substrate 20; an N-type bonding pad (see reference numeral 95 in FIG. 3a) formed on an exposed region of the N-type semiconductor layer 40; and a P-type bonding pad (see reference numeral 90 in FIG. 3a) formed on the P-type semiconductor layer 60.

In this case, an N-type resistive connection film (not shown) and a P-type resistive connection film (not shown) may be further provided below the N-type bonding pad and the P-type bonding pad, respectively. Moreover, a transparent electrode layer 70 may be further provided between the P-type semiconductor layer 60 and the P-type bonding pad. In addition, metallic electrodes may be formed on the semiconductor layers 40 and 60 to connect adjacent cells to each other.

The substrate 20 refers to a typical wafer for use in manufacturing a light emitting diode, and it is preferred that the substrate 20 be made of any one of $Al_2O_3$, SiC, ZnO, Si, GaAs, GaP, $LiAl_2O_3$, BN, AN and GaN. This embodiment employs a sapphire substrate 20 for crystal growth.

The buffer layer 30 is a layer for reducing lattice mismatch between the substrate 20 and the subsequent layers upon growth of crystals and contains GaN that is a semiconductor material. The N-type semiconductor layer 40 is a layer in which electrons are produced, and is composed of an N-type compound semiconductor layer and an N-type cladding layer. At this time, GaN doped with N-type impurities is used for the N-type compound semiconductor layer. The P-type semiconductor layer 60 is a layer in which holes are produced, and is composed of a P-type cladding layer and a P-type compound semiconductor layer. At this time, AlGaN doped with P-type impurities is used for the P-type compound semiconductor layer.

The active layer 50 is a region in which a predetermined band gap and a quantum well are formed so that electrons and holes are recombined. The active layer contains InGaN. Further, the wavelength of emitted light, which is generated due to the combination of an electron and a hole, varies depending on the kind of a material constituting the active layer 50. Therefore, it is preferred that a semiconductor material contained in the active layer 50 be controlled depending on a target wavelength.

The N-type and P-type bonding pads are pads for use in electrically connecting the light emitting cell 100 to metallic wiring and may be formed to have a structure with laminated Ti/Au. Further, the aforementioned transparent electrode layer 70 performs the function of uniformly transmitting a voltage input through the P-type boding pad to the P-type semiconductor layer 60.

As described above, the light emitting cell 100 of the present invention refers to a horizontal light emitting chip formed on the sapphire substrate 20. In the present invention, since one light emitting element is manufactured using a plurality of light emitting chips rather than one light emitting chip, a conventional light emitting chip is referred to as a light emitting cell.

A method of manufacturing the aforementioned light emitting cell will be briefly described below.

The buffer layer 30, the N-type semiconductor layer 40, the active layer 50 and the P-type semiconductor layer 60 are sequentially formed on the sapphire substrate 20 by means of crystal growth. The transparent electrode layer 70 may be further formed on the P-type semiconductor layer 60. The respective layers are formed through various kinds of deposition and epitaxy methods for depositing the aforementioned materials, including MOCVD (Metal Organic Chemical Vapor Deposition), MBE (Molecular Beam Epitaxy), MBE (Hydride Vapor Phase Epitaxy), and the like.

Thereafter, a photo etching process using a mask is performed so that a portion of the N-type semiconductor layer 40 is opened. In other words, the P-type semiconductor layer 60, the active layer 50 and the N-type semiconductor layer 40 are partially removed through an etching process using the mask as an etching mask so as to expose a portion of the N-type semiconductor layer 40. At this time, the mask is formed using a photoresist into a shape in which a region where an N-type pad is to be formed can be opened and each cell can be electrically insulated. The etching process is performed using a wet etching process or a dry etching process. In this embodiment, a dry etching process using plasma is effective.

Each light emitting cell 100 is electrically separated by continuously performing the etching process. In other words, the N-type semiconductor layer 40 and the buffer layer 30 are etched until the sapphire substrate 20 is exposed, thereby insulating each cell.

Although the etching can be performed using a single mask as described above, it may be performed using different masks. In other words, first etching using a first mask may be performed to open a region where an N-type pad is formed, and second etching using a second mask may be performed to open a predetermined region for electrically separating light emitting cells 100.

After the mask is removed, the N-type pad is formed on the exposed portion of the N-type semiconductor layer 40 and the P-type pad is formed on the P-type semiconductor layer 60.

As described above, the present invention manufactures a light emitting element by arranging the unit light emitting cells in series or parallel. This will be described below with reference to the accompanying drawing.

FIG. 3 shows sectional views of a light emitting element with arrayed cells according to an embodiment of the present invention.

Referring to FIG. 3, the light emitting element of the present invention has a plurality of light emitting cells 100-1 to 100-*n* connected to one another in series. That is, the light emitting element comprises the plurality of light emitting cells 100 in which the N-type semiconductor layers 40 and the P-type semiconductor layers 60 of the adjacent light emitting cells 100-1 to 100-*n* are electrically connected, an N-type pad 95 is formed on the N-type semiconductor layer 40 of a light emitting cell 100-*n* located at one end of the light emitting element, and a P-type pad 90 is formed on the P-type semiconductor layer 60 of a light emitting cell 100-1 located at the other end thereof.

The N-type semiconductor layers 40 and the P-type semiconductor layers 60 of the adjacent light emitting cells 100-1 to 100-*n* are electrically connected to each other using metallic wires 80. Further, in the present invention, it is effective that the plurality of light emitting cells 100-1 to 100-*n* can be connected in series to be driven by a supplied AC voltage. In the present invention, the number of light emitting cells 10 connected in series or parallel may greatly vary depending on a voltage/current for driving a single light emitting cell 100 and an AC driving voltage applied to a light emitting element for illumination. Preferably, 10 to 1000 cells are connected in series, and more preferably, it is effective to connect 30 to 70 cells in series. For example, in driving with an AC voltage of 220V, a light emitting element is manufactured by serially connecting 66 or 67 unit light emitting cells each of which is operated with a voltage of 3.3V at a certain current. Further, in driving with an AC voltage of 110V, a light emitting element is manufactured by serially connecting 33 or 34 unit light emitting cells each of which is operated with a voltage of 3.3V at a certain current.

As shown in FIG. 3a, in the light emitting element with the first to n-th light emitting cells 100-1 to 100-*n* connected in series, the P-type pad 90 is formed on the P-type semiconductor layer 60 of the first light emitting cell 100-1, and the N-type semiconductor layer 40 of the first light emitting cell 100-1 and the P-type semiconductor layer 60 of the second light emitting cell 100-2 are connected through a first wire 80-1. Further, the N-type semiconductor layer 40 of the third light emitting cell 100-3 and a P-type semiconductor layer (not shown) of the fourth light emitting cell (not shown) are connected through a second wire 80-2. An N-type semiconductor layer (not shown) of the (n−2)-th light emitting cell (not shown) and a P-type semiconductor layer 60 of the (n−1)-th light emitting cell 100-n−1 are connected through an (n−1)-th wire 80-n−1, and an N-type semiconductor layer 40 of the (n−1)-th light emitting cell 100-n−1 and a P-type semiconductor layer 60 of the n-th light emitting cell 100-n are connected through an n-th wire 80-n. Further, the N-type pad 95 is formed on the N-type semiconductor layer 40 of the n-th light emitting cell 100-n. At this time, pads that are metallic electrodes are formed on the respective semiconductor layers so that these pads are connected through wiring.

The substrate 20 in the present invention may be a substrate on which a plurality of light emitting elements can be manufactured. Accordingly, a zone designated by "A" as shown FIGS. 3a and 3b refers to a cutting zone for separately cutting the plurality of elements.

Further, in the aforementioned light emitting element, first to fourth diodes (not shown) for rectifying an external AC voltage may be formed on an identical substrate. The first to fourth diodes are arranged in the form of a rectification bridge. Rectification nodes among the first to fourth diodes may be connected to N-type or P-type pads of the respective light emitting cells. The first to the fourth diodes may be used for light emitting cells.

A method of manufacturing the light emitting element with the aforementioned plurality of light emitting cells connected in series will be briefly described below.

The buffer layer 30, the N-type semiconductor layer 40, the active layer 50 and the P-type semiconductor layer 60 are sequentially formed by means of crystal growth on the sapphire substrate 20. The transparent electrode layer 70 may be further formed on the P-type semiconductor layer 60.

A portion of the N-type semiconductor layer 40 is opened through a predetermined patterning process, and each light emitting cell 100 is electrically insulated. In the patterning process, a photoresist is applied on the whole structure, and a photoresist mask (not shown) with predetermined open regions is formed through a predetermined lithography process. The predetermined regions refer to regions between adjacent light emitting cells 100 and regions corresponding to portions of the N-type semiconductor layers 40 to be opened. The P-type semiconductor layer 60 and the active layer 50 are etched by performing an etching process using the photoresist mask as an etching mask, so that the portion of the N-type semiconductor layer 40 can be opened. A portion of the N-type semiconductor layer 40 is etched by continuously performing the etching process to form and electrically insulate each light emitting cell 100.

In addition, a portion of the N-type semiconductor layer 40 may be opened by performing a plurality of patterning processes to insulate each light emitting cell. That is, as shown in FIG. 3a, a portion of the N-type semiconductor layer 40 is exposed by partially etching the P-type semiconductor layer 60, the active layer 50 and the N-type semiconductor layer 40, and each of the light emitting cells 100 is electrically insulated by etching the P-type semiconductor layer 60, the active layer 50, the N-type semiconductor layer 40 and the buffer layer 30 through an additional process. Moreover, as shown in FIG. 3b, each of the light emitting cells 100 may be electrically insulated by performing etching only down to the N-type semiconductor layer 40. The etching process used in the patterning processes may be a wet etching process or a dry etching process. It is effective to perform a dry etching process using plasma in this embodiment.

By using a process identical to the aforementioned manufacturing process, diodes for a rectification bridge may be formed together. It will be apparent that diodes for a rectification bridge may be separately formed through a typical semiconductor manufacturing process.

Thereafter, the conductive wires 80-1 to 80-n for electrically connecting the N-type semiconductor layers 40 and the P-type semiconductor layers 60 of the adjacent light emitting cells 100-1 to 100-n are formed through a predetermined process such as a bridge process or step coverage. The conductive wires 80-1 to 80-n are formed of a conductive material and preferably using a silicone compound doped with metallic impurities.

The aforementioned bridge process is also referred to as an air bridge process, wherein a photoresist pattern is formed between chips to be connected to each other by applying and developing a photoresist solution using a photo process, a thin film is first formed thereon through a method such as vacuum vapor deposition with a material such as metal, and a conductive material including gold (Au) is again applied thereon to be a predetermined thickness through a method such as plating or metal vapor deposition. Thereafter, when the photoresist pattern is removed by a solution such as a solvent, all parts below the conductive material are removed and only the conductive material in the form of a bridge is formed in space.

Further, in the step coverage process, only connection portions between chips to be connected to each other are left by applying and developing a photoresist solution using a photo process and the other portions are covered with a photoresist pattern, and a conductive material including gold (Au) is applied thereon to be a predetermined thickness through a method such as plating or metal vapor deposition. Subsequently, when the photoresist pattern is removed by a solution such as a solvent, all the other portions excluding the portions covered with the conductive material are removed so that the only covered portions can be left to perform the function of electrically connecting the chips to each other.

Meanwhile, the P-type pad 90 and the N-type pad 95 for electrical connection with the outside are formed on the light emitting cells 100-1 and 100-n located at both ends of the light emitting element, respectively. Diodes for a rectification bridge may be connected to each of the P-type pad 90 and the N-type pad 95. Alternatively, additional conductive wires may be connected to the P-type pad 90 and the N-type pad 95.

The aforementioned method of manufacturing the light emitting element of the present invention is only a specific embodiment and is not limited thereto. Various processes and manufacturing methods may be modified or added depending on the characteristics of an element and convenience of a process. In addition, it is possible to manufacture a light emitting element by serially connecting vertical light emitting cells rather than the horizontal light emitting cells described above.

In the present invention, a plurality of individual vertical light emitting cells are bonded on a substrate, and different electrode pads of adjacent cells of the plurality of individual vertical light emitting cells are electrically connected. In other words, a light emitting element can be formed by connecting light emitting cells in series or parallel.

A vertical light emitting cell and a light emitting element with vertical light emitting cells connected in series or parallel will be described with reference to the accompanying drawings. Descriptions overlapping with the descriptions of the aforementioned horizontal light emitting cell and the light emitting element with horizontal light emitting cells connected in series or parallel will be omitted below.

FIG. 4 shows a sectional view of a unit light emitting cell according to another embodiment of the present invention.

Referring to FIG. 4, the unit light emitting cell of this embodiment is a vertical light emitting cell 200 in which an N-type pad 210, an N-type semiconductor layer 220, an active layer 230, a P-type semiconductor layer 240 and a P-type pad 250 are sequentially laminated in structure. It will be apparent that various material layers may be further added depending on the characteristics of a light emitting cell.

When a method of manufacturing the vertical light emitting cell with the aforementioned structure is briefly reviewed, a buffer layer (not shown), an N-type semiconductor layer 220, an active layer 230, a P-type semiconductor layer 240 and a P-type pad 250 are sequentially formed on a parent substrate (not shown) by means of crystal growth. At this time, an ITO film (not shown) may be formed between the P-type semiconductor layer 240 and the P-type pad 250.

The P-type pad 250, the P-type semiconductor layer 240, the active layer 230, the N-type semiconductor layer 220 and the buffer layer are partially etched to electrically separate each light emitting cell. Thereafter, a conductive host substrate (not shown) is bonded to the P-type pad 250, and the buffer layer and the parent substrate below the N-type semiconductor layer 220 are then removed through a laser liftoff process. The N-type pad 210 is formed beneath the N-type semiconductor layer 220 and the host substrate is cut into individual light emitting cells to manufacture vertical light emitting cells 200.

In this embodiment, various methods may be provided for manufacturing a light emitting element in which the light emitting cells with the aforementioned structure are bonded to the substrate and the light emitting cells are connected in series.

FIG. 5 shows sectional views illustrating a method of manufacturing a light emitting element with arrayed cells according to a first modified example of the other embodiment of the present invention.

Referring to FIG. 5, a plurality of vertical light emitting cells 200 each of which has an active layer 230 formed between an N-type semiconductor layer 220 and a P-type semiconductor layer 240, and electrode pads 210 and 250 formed respectively on the N-type semiconductor layer 220 and the P-type semiconductor layer 240 are bonded to a substrate 201.

A substrate made of at least one of $Al_2O_3$, SiC, ZnO, Si, GaAs, GaP, $LiAl_2O_3$, BN, AN and GaN, an insulating substrate made of resin, plastic or the like, or a substrate with excellent thermal conductivity may be used as the substrate 201. If a conductive substrate is used, a substrate with an insulating layer formed thereon is used.

Thereafter, the light emitting cells 200 are bonded to the substrate 201 using pre-determined paste (not shown). At this time, the P-type pad 250 of the light emitting cell 200 is bonded to the substrate 201. It will be apparent that both of them can be bonded using various bonding methods. Although the P-type pad 250 is bonded to the substrate 201 in this modified example, the N-type pad 210 may be bonded to the substrate 201.

Next, the N-type pad 210, N-type semiconductor layer 220, the active layer 230 and the P-type semiconductor layer 240 are partially etched through a predetermined etching process so that a portion of the P-type pad 250 can be exposed. This achieves a configuration in which a portion of the P-type pad 250 is exposed at a lower portion of the light emitting cell 200, as shown in FIG. 5. Electrodes of adjacent light emitting cells 200 are connected through a predetermined wire forming process. That is, the exposed portion of the P-type pad 250 of one light emitting cell 200 and the N-type pad 210 of another light emitting cell 200 adjacent thereto are connected through a wire 260. At this time, the conductive wire 260 for electrically connecting the N-type pad 210 and the P-type pad 250 of the adjacent light emitting cells are formed through a predetermined process such as a bridge process or step coverage.

All materials having conductivity as well as metal can be used for the wire 260. The aforementioned wire forming process is not limited thereto but may be implemented in various manners. This will be described later.

An additional external terminal electrode (not shown) is formed on each of the P-type pad 250 of a light emitting cell 200 located at the one end of the light emitting element of the present invention and the N-type pad 210 of a light emitting cell 200 located at the other end thereof so that predetermined power can be input from the outside.

FIG. 6 shows a sectional view illustrating a method of manufacturing a light emitting element with arrayed cells according to a second modified example of the other embodiment of the present invention.

Referring to FIG. 6, as described in the previous modified example, vertical light emitting cells 200 are bonded to a substrate 201, and a portion of a P-type pad 250 is then exposed through a predetermined etching process.

Thereafter, a predetermined insulation film 255 for preventing a short circuit with subsequent wiring is formed on the substrate 201 between the exposed portion of the P-type pad 250 and a light emitting cell 200 adjacent thereto. Then, electrodes of the adjacent light emitting cells 200 are connected through a wire 260 using a pre-determined metal wiring process. Such an insulation film 255 and wire 260 may be formed through a printing process or through a predetermined vapor deposition, patterning and etching process.

The manufacture of the light emitting element is not limited to the aforementioned process. Without performing an etching process for the light emitting cell, an electrode pattern having a width larger than that of the light emitting cell may be formed on the substrate and the light emitting cell may be then bonded to the electrode pattern. Although the P-type pad is bonded to the substrate in this modified example, an N-type pad may be bonded to the substrate.

FIG. 7 shows sectional views illustrating a method of manufacturing a light emitting element with arrayed cells according to a third modified example of the other embodiment of the present invention.

Referring to FIGS. 7(a) and 7(b), P-type pads 250 of vertical light emitting cells 200 are bonded to electrode patterns 202 formed on a substrate 201.

The electrode patterns 202 formed on the substrate 201 may be arranged in various arrays for serially connecting the light emitting cells 200. It will be apparent that the electrode patterns 202 are formed as many as the number of desired light emitting cells 200 and broader in width in one direction than that of each of the light emitting cells 200. Further, each of the electrode patterns 202 is separated electrically and physically.

At this time, since the electrode patterns 202 are formed on the substrate 201 in this modified example, the electrode patterns 202 on the substrate 201 may be used as the P-type pads 250 without forming the P-type pad 250 on the light emitting cell 200. Further, although the P-type pads 250 are bonded to the substrate 201 in this modified example, the N-type pads 210 may be bonded to the substrate 201. At this time, the N-type pad 210 may not be formed.

Here, conductive paste is used to bond the P-type pads 250 of the light emitting cells 200 to the electrode patterns on the substrate 201. It will be apparent that they can be bonded using other various bonding methods. At this time, as shown in FIG. 7(b), the light emitting cell 200 is aligned with one side of the underlying electrode pattern 202 so that a portion of the other side of the underlying electrode pattern 202 is exposed.

Thereafter, an electrode pattern 202 with a light emitting cell 200 bonded thereto is electrically connected using a conductive wire 260 to an N-type pad 210 of an adjacent light emitting cell 200. Therefore, the N-type pad 210 of the adjacent light emitting cell 200 is connected through the electrode pattern 202 and the wire 260 to a P-type pad 250 of the one light emitting cell 200 so that a plurality of light emitting cells 200 are connected in series.

The aforementioned modified examples are not limited themselves but conversion can be made therebetween. In other words, a plurality of semiconductor layers may be further added to form semiconductor layers. To connect adjacent light emitting cells to one another, the adjacent light emitting cells are electrically insulated by forming additional insulation films, and each electrode is then exposed to connect the adjacent light emitting cells using predetermined wires.

FIG. 8 is a conceptual diagram illustrating a light emitting element according to a first embodiment of the present invention.

Referring to FIG. 8, in the light emitting element 300 of this embodiment, a plurality of light emitting cells 100 and 200 connected in series are electrically connected to the outside.

In the light emitting element 300, first and second electrodes 310 and 320 are formed on an N-type pad 95 or 210 and a P-type pad 90 or 250 through a wiring process, respectively. The first and the second electrodes 310 and 320 refer to an anode electrode and a cathode electrode, respectively. Accordingly, a single light emitting element 300 with the plurality of light emitting cells 100 and 200 connected in series is manufactured.

In addition, it is possible to provide a light emitting element with an additional controller added thereto so that the light emitting element can be operated even in AC driving.

This embodiment is not limited to the case where a plurality of light emitting cells are connected in series, but a light emitting element may be manufactured by connecting a plurality of light emitting cell blocks each of which has a plurality of serially connected light emitting cells in parallel. This will be described later.

FIG. 9 is a conceptual diagram illustrating a light emitting element according to a second embodiment of the present invention.

Referring to FIG. 9, at least two light emitting cell blocks 1000 a and 1000 b each of which has a plurality of serially connected light emitting cells 100 and 200 are connected to each other in reverse parallel between electrodes.

In FIG. 9, a first light emitting cell block 1000a and a second light emitting cell block 1000 b are connected in parallel between first and second electrodes 310 and 320. At this time, a cathode of the first light emitting cell block 1000a is connected to the first electrode 310, and an anode thereof is connected to the second electrode 320. Further, a cathode of the second light emitting cell block 1000b is connected to the second electrode 320, and an anode thereof is connected to the first electrode 310. This is only a specific embodiment, and two or more light emitting cell blocks 1000 may be connected in parallel. Further, each of the two light emitting cell blocks 1000a and 1000b connected in parallel may be configured to include light emitting cells 100 and 200 of which the number is half of the number of the light emitting cells 100 and 200 described above. For example, if the number of light emitting cells 100 and 200 within a light emitting cell block 1000 included in the light emitting element 300 are forty, the forty light emitting cells can be divided into each twenty light emitting cells within the first light emitting cell block 1000a and the second light emitting cell block 1000b. It will be apparent that the number of light emitting cells 100 and 200 within the first and second cell blocks 1000a and 1000b is not limited thereto. However, it is preferred that the respective numbers of light emitting cells 100 and 200 within the first and second cell blocks 1000a and 1000b be the same to minimize variation in the brightness of the light emitting element.

The operation of the light emitting element according to the second embodiment of the present invention constructed as above will be explained below. If a positive (+) voltage is applied to the first electrode 310 and a negative (−) voltage is applied to the second electrode 320, the second light emitting cell block 1000b emits light. Meanwhile, if a negative (−) voltage is applied to the first electrode 310 and a positive (+) voltage is applied to the second electrode 320, the first light emitting cell block 1000a emits light. In other words, since the first and second light emitting cell blocks 1000a and 1000b alternately emit light even though external AC power is applied to the light emitting element, it is possible to use the light emitting element even with an AC power source. Further, since a power source used at home has a frequency of 60 Hz, there is no problem even in the case where two light emitting cell blocks 1000a and 1000b alternately emit light.

In addition, it is possible to manufacture a light emitting element including an additional bridge unit for a certain rectifying operation.

FIG. 10 is a conceptual diagram illustrating a light emitting element according to a third embodiment of the present invention.

Referring to FIG. 10, the light emitting element 300 of this embodiment comprises a plurality of light emitting cells 100 and 200 connected in series, a rectifying bridge unit 301 for applying a predetermined current to the light emitting cells 100 and 200, and electrodes 310 and 320 connected to the rectifying bridge unit 301.

In this embodiment, the plurality of light emitting cells 100 and 200 are electrically connected to an external power source not directly but through the rectifying bridge unit 301 connected to first and second electrodes 310 and 320. The rectifying bridge unit 301 comprises a first diode D1 connected to the first electrode 310 and an anode terminal of the light emitting cells 100 and 200, a second diode D2 connected to the second electrode 320 and an anode terminal of the light emitting cells 100 and 200, a third diode D3 connected to the second electrode 320 and a cathode terminal of the light emitting cells 100 and 200, and a fourth diode D4 connected to the first electrode 310 and the cathode terminal of the light emitting cells 100 and 200. Thus, in the rectifying bridge unit 301, a current is applied to the serially connected light emitting cells 100 and 200 through the bridge diodes D1 and D3 arranged in a forward direction when a forward voltage is applied, whereas a current is applied to the serially connected light emitting cells 100 and 200 through the bridge diodes D2 and D4 arranged in a reverse direction when a reverse voltage is applied. Accordingly, the light emitting element 300 continuously emits light regardless of whether a power source is an AC power source.

Further, the external power may be simultaneously applied to the rectifying bridge and the serially connected light emitting cells.

FIG. 11 is a conceptual diagram illustrating a light emitting element according to a fourth embodiment of the present invention.

Referring to FIG. 11, the light emitting element 300 of this embodiment comprises a plurality of light emitting cells 100 and 200 connected in series, a rectifying bridge unit 301 for applying a predetermined current to the light emitting cells 100 and 200, and electrodes 310 to 340 connected to the light emitting cells 100 and 200 and the rectifying bridge unit 301.

In this embodiment, the plurality of serially connected light emitting cells 100 and 200 are electrically connected to an external power source through second and fourth electrodes 320 and 340, and through the rectifying bridge unit 301 connected to first and third electrodes 310 and 330. The same power source or different power sources may be connected to the light emitting cells 100 and 200 and the rectifying bridge unit 301.

The rectifying bridge unit 301 comprises a first diode D1 connected between the first electrode 310 and the second electrode 320, a second diode D2 connected between the second electrode 320 and the third electrode 330, a third diode D3 connected between the third electrode 330 and the fourth electrode 340, and a fourth diode D4 connected between the fourth electrode 340 and the first electrode 310. Here, the second electrode 320 and the fourth electrode 340 are connected to the anode and the cathode of the light emitting cells 100 and 200, respectively.

In this embodiment, AC power is applied through the rectifying bridge unit 301, and the second electrode 320 and the fourth electrode 340 are separately provided for use in connecting an external RC filter. DC power is applied directly to the light emitting cells 100 and 200. Accordingly, the number of entire input/output electrode terminals in the light emitting element 300 of the present invention is four. In this case, two electrodes are provided for AC driving, and the other two electrodes are provided for use in connecting an RC filter in parallel. The function of the RC filter is to minimize a ripple factor in a current.

FIG. 12 is a conceptual diagram illustrating a light emitting element according to a fifth embodiment of the present invention.

Referring to FIG. 12, the light emitting element 300 of this embodiment comprises a plurality of light emitting cells 100 and 200 connected in series, a rectifying bridge unit 301 for applying a predetermined current to the light emitting cells 100 and 200, electrodes 310 and 320 connected to the rectifying bridge unit 301, a negative electrode 350 for external connection, which is connected to the rectifying bridge unit 301 and provided for controlling the resistance of an LED array, and a positive electrode 360 for DC, which is connected to the light emitting cells 100 and 200.

In this embodiment, a resistor may be optionally connected in series between the positive electrode 360 of the plurality of serially connected light emitting cells 100 and 200 and the negative electrode 350 for external connection, thereby preventing overload.

The rectifying bridge unit 301 comprises a first diode D1 connected between the first electrode 310 and the negative electrode 350 for external connection, a second diode D2 connected between the negative electrode 350 for external connection and the second electrode 320, a third diode D3 connected between the second electrode 320 and the cathode of the light emitting cells 100 and 200, and a fourth diode D4 connected between the first electrode 310 and the cathode of the light emitting cells 100 and 200.

FIG. 13 is a conceptual diagram illustrating a light emitting element according to a sixth embodiment of the present invention.

Referring to FIG. 13, the light emitting element 300 of this embodiment comprises a plurality of light emitting cells 100 and 200 connected in series, a rectifying bridge unit 301 for applying a predetermined current to the light emitting cells 100 and 200, electrodes 310 to 340 connected to the rectifying bridge unit 301 and the light emitting cells 100 and 200, and a negative electrode 350 for external connection, which is connected to the rectifying bridge unit 301.

In this embodiment, the two terminals 310 and 330 of the rectifying bridge unit 301 are connected to an AC power source, and an RC circuit is connected to second and fourth electrodes 320 and 340 to which the plurality of serially connected light emitting cells 100 and 200 are connected, thereby minimizing a ripple factor in an AC current and preventing overload.

The rectifying bridge unit 301 comprises a first diode D1 connected between the first electrode 310 and the negative electrode 350 for external connection, a second diode D2 connected between the negative electrode 350 for external connection and the third electrode 330, a third diode D3 connected between the third electrode 330 and the fourth electrode 340, and a fourth diode D4 connected between the fourth electrode 340 and the first electrode 310. Here, the fourth electrode 340 is connected to the cathode of the light emitting cells 100 and 200.

In this embodiment, the number of entire input/output electrode terminals is five, and AC power is applied through the rectifying bridge unit 301. Remaining electrodes are the negative electrode 350 for external connection, and the two electrodes 320 and 340 to which an RC circuit is connected in parallel.

FIG. 14 is a conceptual diagram illustrating a light emitting device according to the present invention.

Referring to FIG. 14, the light emitting device comprises a power source unit 410, a light emitting element 300 with a plurality of light emitting cells 100 and 200 connected in series, and a control unit 420 for controlling waveforms of a voltage and a current applied to the light emitting element 300.

In this figure, AC power is applied by the power source unit 410, and a parallel RC circuit and a serial resistor included in the control unit 420 are connected to the light emitting element 300.

The control unit 420 includes a capacitor C1 and a first resistor R1, which are connected in parallel to the light emitting cells 100 and 200 within the light emitting element 300. The control unit may further include a second resistor R2 connected in series to the light emitting cells 100 and 200.

The structure and operation of a light emitting device for illumination will be described in detail with reference to FIG. 14.

The rectifying bridge unit 301 of the light emitting element 300 is connected to the AC power source. The second resistor R2 and the light emitting cells 100 and 200 are connected in series between two nodes of the rectifying bridge unit 301, to which the first and second terminals are not connected. Further, the second resistor R2 and the light emitting cells 100 and 200, which are connected in series to each other, are connected in parallel to the first capacitor C1 and the first resistor R1.

Therefore, if AC power is applied to the light emitting device, positive and negative currents divided through the rectifying bridge unit 301 in the light emitting element 300 is applied in both directions of the light emitting cells 100 and 200, thereby sequentially emitting light. Further, the waveform of the current is controlled due to the capacitor C1 and the resistors R1 and R2, which are connected in parallel.

What is claimed is:

1. A light emitting diode, comprising:
    a substrate;
    a plurality of light emitting cells arranged on the substrate, each light emitting cell comprising a lower semiconductor layer on the substrate, an active layer on the lower semiconductor layer, and an upper semiconductor layer on the active layer;
    an upper electrode arranged on each light emitting cell; and
    a lower electrode arranged between the substrate and the lower semiconductor layer of each light emitting cell,
    wherein the lower electrode arranged under one of the plurality of light emitting cells is coupled to the upper electrode arranged on another one of the plurality of light emitting cells adjacent to the one of the plurality of light emitting cells.

2. The light emitting diode of claim 1, further comprising an insulation layer arranged between the substrate and the lower electrode, the substrate comprising an electrically conductive substrate.

3. The light emitting diode of claim 1, further comprising an insulation layer arranged on a side surface of each light emitting cell.

4. The light emitting diode of claim 1, wherein a portion of the lower electrode is exposed in each light emitting cell.

5. The light emitting diode of claim 1, wherein the lower electrode is coupled to the upper electrode arranged on one of the plurality of light emitting cells adjacent to the one of the plurality of light emitting cells using an air-bridge process or a step coverage process.

6. The light emitting diode of claim 1, wherein a group of the plurality of light emitting cells is configured to emit light in response to application of a forward bias cycle of an alternating current (AC) power, and
    wherein another group of the plurality of light emitting cells is configured to emit light in response to application of a reverse bias cycle of the AC power.

7. The light emitting diode of claim 6, wherein at least one light emitting cell of the group of the plurality of light emitting cells configured to emit light in response to application of the forward bias cycle of the AC power is also configured to emit light in response to application of the reverse bias cycle of the AC power.

8. A light emitting diode, comprising:
    a substrate;
    a plurality of light emitting cells arranged on the substrate, each light emitting cell comprising a lower semiconductor layer on the substrate, an active layer on the lower semiconductor layer, and an upper semiconductor layer on the active layer;
    an upper electrode arranged on each light emitting cell; and
    a lower electrode arranged between the substrate and the lower semiconductor layer of each light emitting cell,
    wherein the lower electrode arranged under one of the plurality of light emitting cells is coupled to the upper electrode of each of two light emitting cells adjacent to the one of the plurality of light emitting cells.

9. The light emitting diode of claim 8, wherein the upper electrode arranged on one light emitting cell is coupled to the lower electrode arranged under each of two adjacent light emitting cells.

10. The light emitting diode of claim 8, further comprising an insulation layer arranged between the substrate and the lower electrode, the substrate comprising an electrically conductive substrate.

11. The light emitting diode of claim 8, further comprising an insulation layer arranged on a side surface of each light emitting cell.

12. The light emitting diode of claim 8, wherein a portion of the lower electrode is exposed in each light emitting cell.

13. The light emitting diode of claim 8, wherein the lower electrode is coupled to the upper electrode arranged on one of the plurality of light emitting cells adjacent to the one of the plurality of light emitting cells using an air-bridge process or a step coverage process.

14. A light emitting diode, comprising:
    a substrate;
    a plurality of light emitting cells arranged on the substrate, each light emitting cell comprising a lower semiconductor layer on the substrate, an active layer on the lower semiconductor layer, and an upper semiconductor layer on the active layer;
    an upper electrode arranged on each light emitting cell;
    a lower electrode arranged between the substrate and the lower semiconductor layer of each light emitting cell; and
    a light emitting cell block comprising at least one light emitting cell of the plurality of light emitting cells,
    wherein the light emitting cell block is configured to emit light in response to application of a forward bias cycle of an alternating current (AC) power, and
    wherein the lower electrode of an end portion of the light emitting cell block is coupled to the upper electrode of each of two light emitting cells adjacent to the end portion of the light emitting cell block.

15. The light emitting diode of claim 14, wherein the upper electrode of another end portion of the light emitting cell block is coupled to the lower electrode of each of two light emitting cells adjacent to the another end portion of the light emitting cell block.

16. The light emitting diode of claim 14, further comprising an insulation layer arranged between the substrate and the lower electrode, the substrate comprising an electrically conductive substrate.

17. The light emitting diode of claim 14, further comprising an insulation layer arranged on a side surface of each light emitting cell.

18. The light emitting diode of claim 14, wherein a portion of the lower electrode is exposed in each light emitting cell.

19. The light emitting diode of claim 14, wherein the lower electrode is coupled to the upper electrode using an air-bridge process or a step coverage process.

20. A light emitting device, comprising:
    a substrate;
    a plurality of light emitting cells, each light emitting cell comprising a lower electrode arranged on the substrate, a first semiconductor layer arranged on the lower electrode, an active layer arranged on the first semiconductor layer, a second semiconductor layer arranged on the active layer, and an upper electrode arranged on the second semiconductor layer; and
    an insulation film arranged between the lower electrode of a first light emitting cell of the plurality of light emitting cells and the lower electrode of a second light emitting cell of the plurality of light emitting cells, the first light emitting cell being adjacent to the second light emitting cell, wherein the plurality of light emitting cells comprises a first light emitting cell block comprising at least two light emitting cells and a second light emitting cell block comprising at least four light emitting cells, and wherein the lower electrode of the light emitting cell at a first end of the first light emitting cell block is electrically connected to the upper electrode of each of two light emitting cells of the second light emitting cell block, without any other light emitting cells between them, via a first conductor arranged on the insulation film, and the upper electrode of the light emitting cell at a second end of the first light emitting cell block is electrically connected to the lower electrode of each of another two light emitting cells in the second light emitting cell block, without any other light emitting cells between them, via a second conductor arranged on the insulation film.

21. The light emitting device of claim 20, wherein the substrate comprises a conductive substrate and an insulation layer is arranged between the substrate and the lower electrode of each light emitting cell.

22. The light emitting device of claim 20, wherein a portion of the lower electrode of each light emitting cell is exposed outside the light emitting cell.

23. The light emitting device of claim 20, wherein each light emitting cell in the first light emitting cell block is to emit light in response to application of both a forward and a reverse voltage of an alternating current (AC) power source, and each light emitting cell in the second light emitting cell block is to emit light upon application of a forward or a reverse voltage of the AC power source.

24. A light emitting device, comprising:
a substrate;
a plurality of light emitting cells, each light emitting cell comprising a lower electrode arranged on the substrate, a first semiconductor layer arranged on the lower electrode, an active layer arranged on the first semiconductor layer, a second semiconductor layer arranged on the active layer, and an upper electrode arranged on the second semiconductor layer; and
an insulation film arranged between the lower electrode of a first light emitting cell of the plurality of light emitting cells and a second light emitting cell of the plurality of light emitting cells, the first light emitting cell being adjacent to the second light emitting cell, wherein the plurality of light emitting cells comprises:
a light emitting cell block comprising at least two light emitting cells, each light emitting cell in the light emitting cell block to emit light in response to application of both a forward and a reverse voltage of an alternating current (AC) power source; and
a rectifying bridge comprising at least two light emitting cells to emit light only is in response to application of a forward voltage of the AC power source and at least two light emitting cells to emit light only in response to application of a reverse voltage of the AC power source, wherein the lower electrode of the light emitting cell at a first end of the light emitting cell block is electrically connected to the upper electrode of each of two light emitting cells of the rectifying bridge via a conductor arranged on the insulation film, and the upper electrode of the light emitting cell at a second end of the light emitting cell block is electrically connected to the lower electrode of each of another two light emitting cells in the rectifying bridge via a second conductor arranged on the insulation film.

25. The light emitting device of claim 24, wherein the substrate comprises a conductive substrate and an insulation layer is arranged between the substrate and the lower electrode of each light emitting cell.

26. The light emitting device of claim 24, wherein a portion of the lower electrode of each light emitting cell is exposed outside the light emitting cell.

* * * * *